United States Patent
Baringer

(10) Patent No.: US 9,705,519 B1
(45) Date of Patent: Jul. 11, 2017

(54) CORRECTION TECHNIQUE FOR ANALOG PULSE PROCESSING TIME ENCODER

(71) Applicant: HRL Laboratories, LLC, Malibu, CA (US)

(72) Inventor: Cynthia D. Baringer, Piedmont, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/196,496

(22) Filed: Jun. 29, 2016

(51) Int. Cl.
  *H03M 7/34* (2006.01)
  *H03M 1/06* (2006.01)
  *H03M 7/30* (2006.01)

(52) U.S. Cl.
  CPC .......... *H03M 1/06* (2013.01); *H03M 7/3073* (2013.01)

(58) Field of Classification Search
  CPC .. H03M 1/0609; H03M 1/1245; H03M 1/504; H03M 1/38; H03M 1/181; H03M 1/06; H03M 1/60; H03M 7/08; H04L 1/0068; H04L 1/0618; H04L 1/0669; H04L 1/0891

USPC ............... 341/51–65; 714/746, 790
See application file for complete search history.

(56) References Cited

U.S. PATENT DOCUMENTS

| | | | |
|---|---|---|---|
| 6,591,200 B1 * | 7/2003 | Cohen | G01L 3/00 324/160 |
| 7,515,084 B1 | 4/2009 | Cruz-Albrecht et al. | |
| 7,750,835 B1 | 7/2010 | Cruz-Albrecht et al. | |
| 8,560,928 B2 * | 10/2013 | Kim | H04L 1/0068 714/790 |
| 2016/0126968 A1 * | 5/2016 | Lesso | H03M 1/18 341/155 |

* cited by examiner

*Primary Examiner* — Lam T Mai
(74) *Attorney, Agent, or Firm* — Ladas & Parry

(57) ABSTRACT

A circuit for correcting time encoder errors including a time encoder having a time encoder input, a time encoder output, and a current summing point, and a pulse width modifier coupled to the time encoder output, the pulse width modifier having a current output coupled to the current summing point, and having a corrected output. The pulse width modifier is configured to calibrate duty cycle errors and nonlinearity errors on the time encoder output, to correct the duty cycle errors and the nonlinearity errors on the time encoder output, and to output the corrected output.

22 Claims, 5 Drawing Sheets

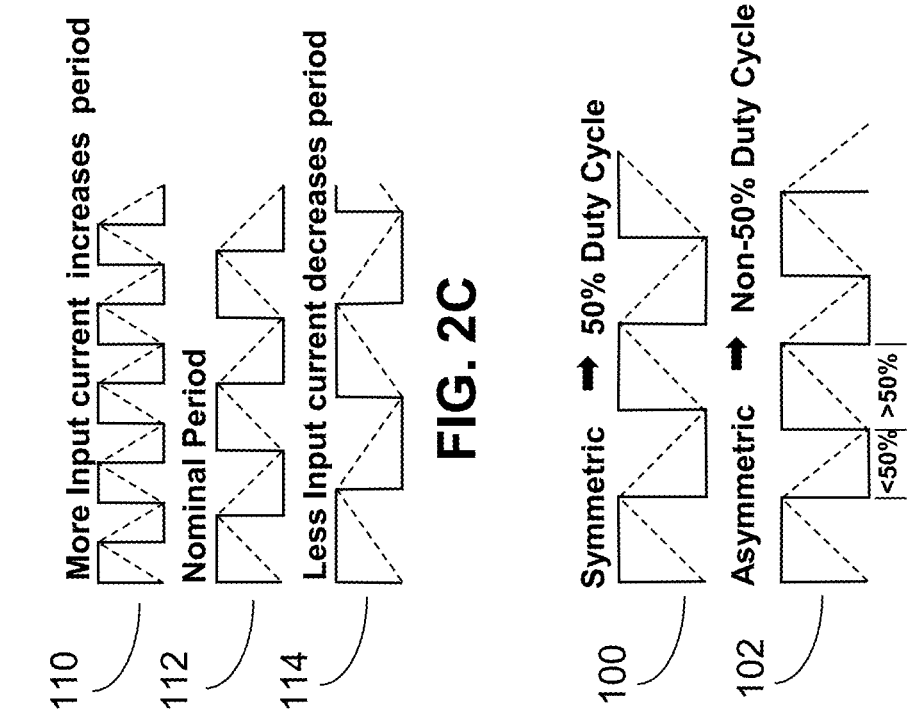
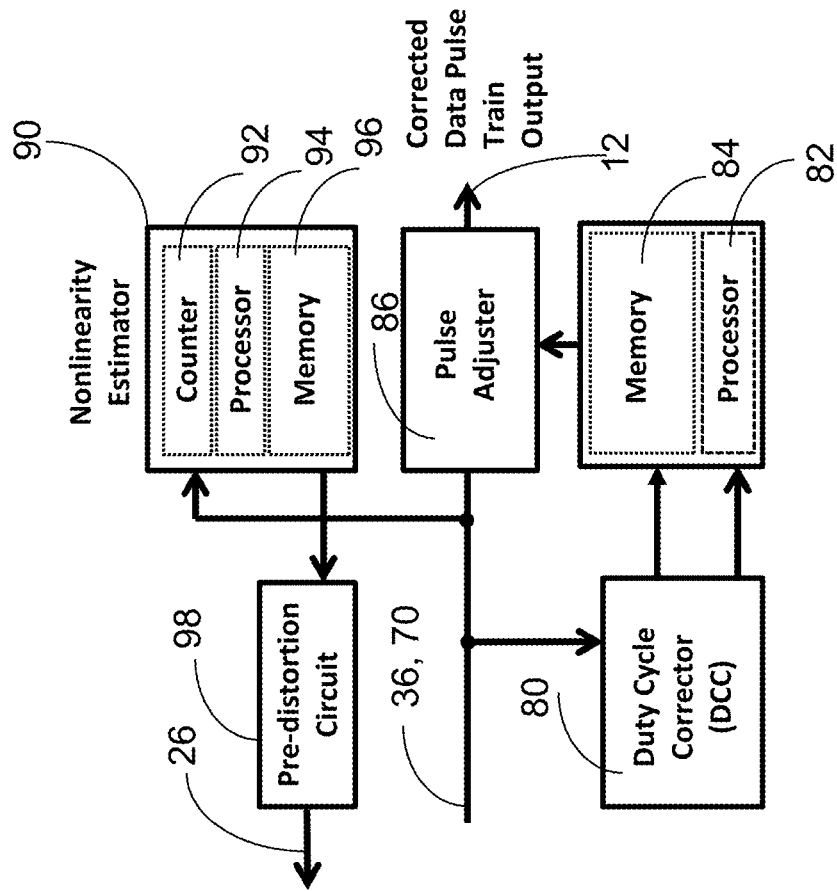
FIG. 2C
FIG. 2B
FIG. 2A

CORRECTION TECHNIQUE FOR ANALOG PULSE PROCESSING TIME ENCODER

TECHNICAL FIELD

This disclosure relates to time encoders.

BACKGROUND

Time encoders have been described in the prior art. For example, U.S. Pat. No. 7,515,084, issued Apr. 7, 2009, and U.S. Pat. No. 7,750,835, issued Jul. 6, 2010, which are incorporated herein by reference, describe time encoders. A time encoder encodes an analog input in the timing of pulses in an output pulse data train. The pulses in the pulse data train are asynchronous and not synchronized to a clock, so it is possible to operate at higher frequencies than with a synchronous clocked system. However, prior art time encoders have less than desirable performance due to non-ideal circuitry, which may include nonlinearities, non-ideal current sources, and circuit offset mismatches.

What is needed is a time encoder that has improved performance. Design time reduction is also desirable. The embodiments of the present disclosure answer these and other needs.

In a first embodiment disclosed herein, a circuit for correcting time encoder errors comprises a time encoder having a time encoder input, a time encoder output, and a current summing point, and a pulse width modifier coupled to the time encoder output, the pulse width modifier having a current output coupled to the current summing point, and having a corrected output, wherein the pulse width modifier is configured to calibrate duty cycle errors and nonlinearity errors on the time encoder output, to correct the duty cycle errors and the nonlinearity errors on the time encoder output, and to output the corrected output.

In another embodiment disclosed herein, a method for correcting time encoder errors comprises providing a time encoder having a time encoder input, a time encoder output, and a current summing point, providing a pulse width modifier coupled to the time encoder output, the pulse width modifier having a current output coupled to the current summing point, and having a corrected output; calibrating duty cycle errors on the time encoder output using the pulse width modifier and storing the duty cycle errors; calibrating nonlinearity errors on the time encoder output using the pulse width modifier and storing the nonlinearity errors, correcting the duty cycle errors and nonlinearity errors, and outputting the corrected output.

In yet another embodiment disclosed herein, a method for reducing time encoder design time comprises providing a time encoder having a time encoder input, a time encoder output, and a current summing point, providing a pulse width modifier coupled to the time encoder output, the pulse width modifier having a current output coupled to the current summing point, and having a corrected output; calibrating duty cycle errors on the time encoder output using the pulse width modifier and storing the duty cycle errors; calibrating nonlinearity errors on the time encoder output using the pulse width modifier and storing the nonlinearity errors, correcting the duty cycle errors and nonlinearity errors, and outputting the corrected output.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 2A shows a diagram of a pulse width modifier in accordance with the present disclosure;

FIG. 2B shows a desirable 50% duty cycle compared to a non-desirable asymmetric duty cycle in accordance with the present disclosure, and FIG. 2C shows timing diagram examples of operation of a time encoder with different input currents in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes time-encoders with digital post-processing of the output pulse stream to correct for manufacturing variations such as circuitry mismatches and offsets as well as correcting for dynamic errors arising from environmental changes.

Performance improvement and design time reduction are key benefits of the present disclosure. Design effort of the time-encoder can be substantially reduced by eliminating the need for a robust verification of the component circuitry. Further, circuit tuning or optimization for offsets or mismatches arising from process variations is not necessary since the circuitry of the present disclosure estimates the resultant errors through a calibration process and then corrects the errors to produce a corrected output data pulse train during real-time operation.

Figure 1A:
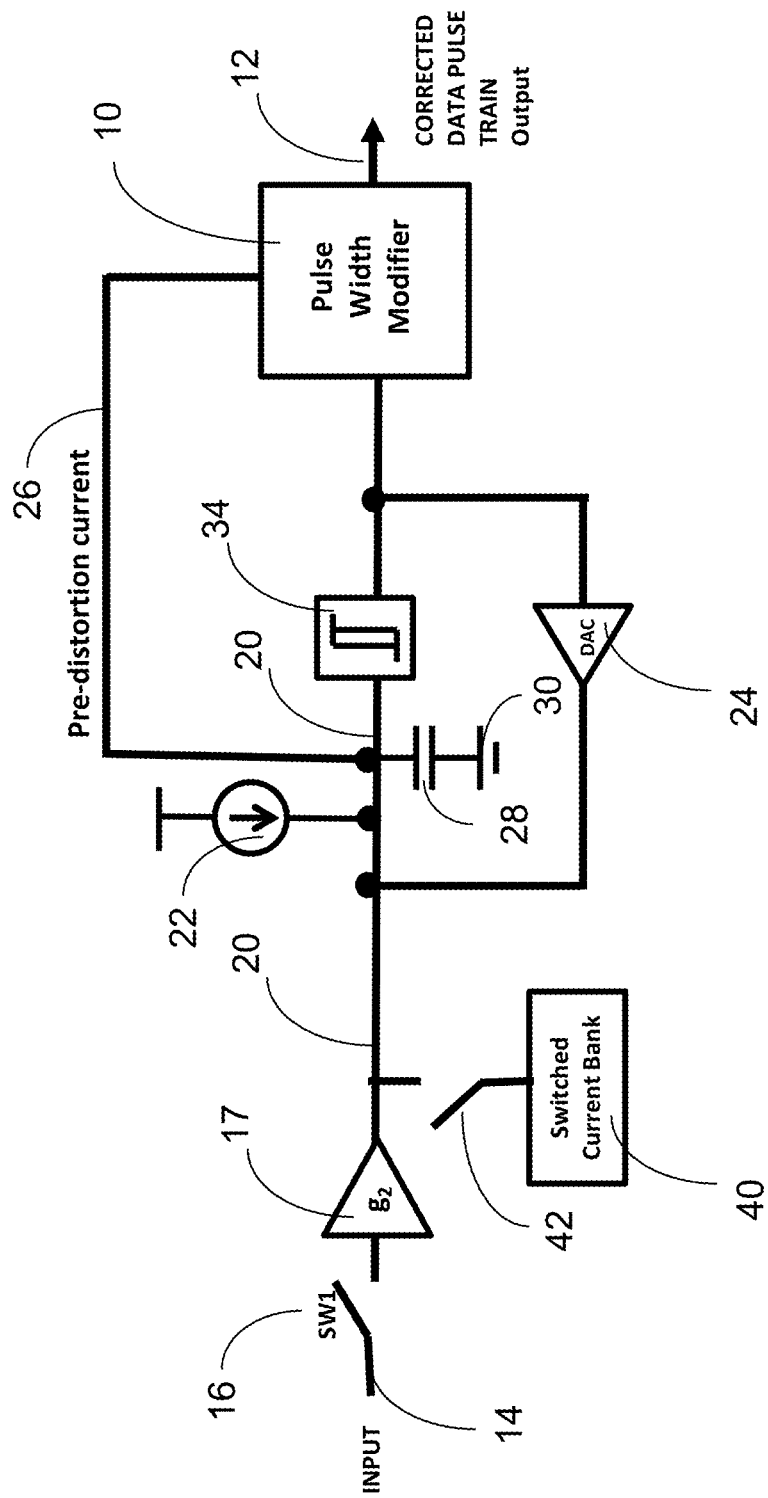
FIG. 1A shows a first order input time encoder in accordance with the present disclosure.

FIG. 1A shows a first order input time encoder in accordance with the present disclosure. The time encoder has a pulse width modifier 10 for static and dynamic correction of the data pulse train output signal 12. For simplicity, the time encoder is shown with single-ended signals; however, the implementation may instead be differential.

As shown, the time encoder has an input 14, which is connected to switch 16, which in turn is connected to a current summing point 20, which is also connected to a current source 22, a 1 bit digital to analog converter (DAC) 24, an integrator or capacitor 28, a hysteresis quantizer 34, and a pre-distortion current 26 from pulse width modifier 10. The capacitor 28 is connected between the current summing point 20 and ground 30. In some implementations a transconductance amplifier 17 may be connected between the switch 16 and the current summing point 20. The output of the hysteresis circuit 34 is connected to the pulse width modifier 10 and to the input of 1 bit DAC 24.

In the prior art, the pulse width modifier 10 is not present and in that case the time encoder output is output 36 of the hysteresis circuit 34. In the present disclosure the output 36 is connected to the pulse width modifier 10, which has an output that is the corrected data pulse train output 12.

At power up, a calibration procedure is executed to characterize any non-ideal performance of the time encoder due to static errors, such as duty cycle errors and nonlinearity errors. The procedure may also be done occasionally during operation to dynamically adapt to environmental changes.

The calibration procedure has two parts. In the first part of calibration, duty cycle errors are characterized that may be due to a finite output resistance from the current source 22 rather than an ideal infinite resistance, and due to offset mismatches in the hysteresis circuit 34 or in any other circuitry, such as differential circuitry. To characterize these errors, the input 14 is set to a non-time varying input such as zero volts. When the input 14 has a non-time varying input, then the output 36 of the hysteresis quantizer should ideally be pulses with a 50% duty cycle, in other words a waveform that has equal high and low periods. If the output 36 is not a 50% duty cycle, then the pulse width modifier 10 characterizes the deviation or error from 50% and stores the characterization of the deviation or error. Then during normal operation the pulse width modifier 10 uses the stored characterization of the deviation or error to correct the output 36 so that the duty cycle error is not present in the corrected data pulse train output 12, as further explained below.

In the second part of calibration, errors due to circuit nonlinearities are characterized. For example, circuit nonlinearities may be introduced by transconductance amplifier 17 in FIG. 1A, and transconductance amplifier 56 in FIG. 1B. During this part of calibration, a calibration switched current bank 40 switch 42 is closed and the current bank 40 is connected by switch 42 to the current summing point 20. The current bank 40 may be controlled to inject selected DC currents into the current summing point during calibration. In normal operation the calibration switched current bank 40 is disconnected from the current summing point 20 and the switch 42 is open. Any non-linearity is calibrated during this second part of calibration by injecting various direct current (DC) input currents into the current summing point 20. The periodicity of the pulse train at output 36 is ideally linearly related to small changes in the DC input currents. Therefore, by observing the changes in the periodicity of the output 36, the pulse width modifier 10 can characterize any non-linearity in the time encoder and store the characterization of non-linearity error. Then the pulse width modifier 10 during normal operation uses the characterization of non-linearity error to correct the output 36 so that the non-linearity error is not present in the corrected data pulse train output 12, as further explained below.

Figure 1B:
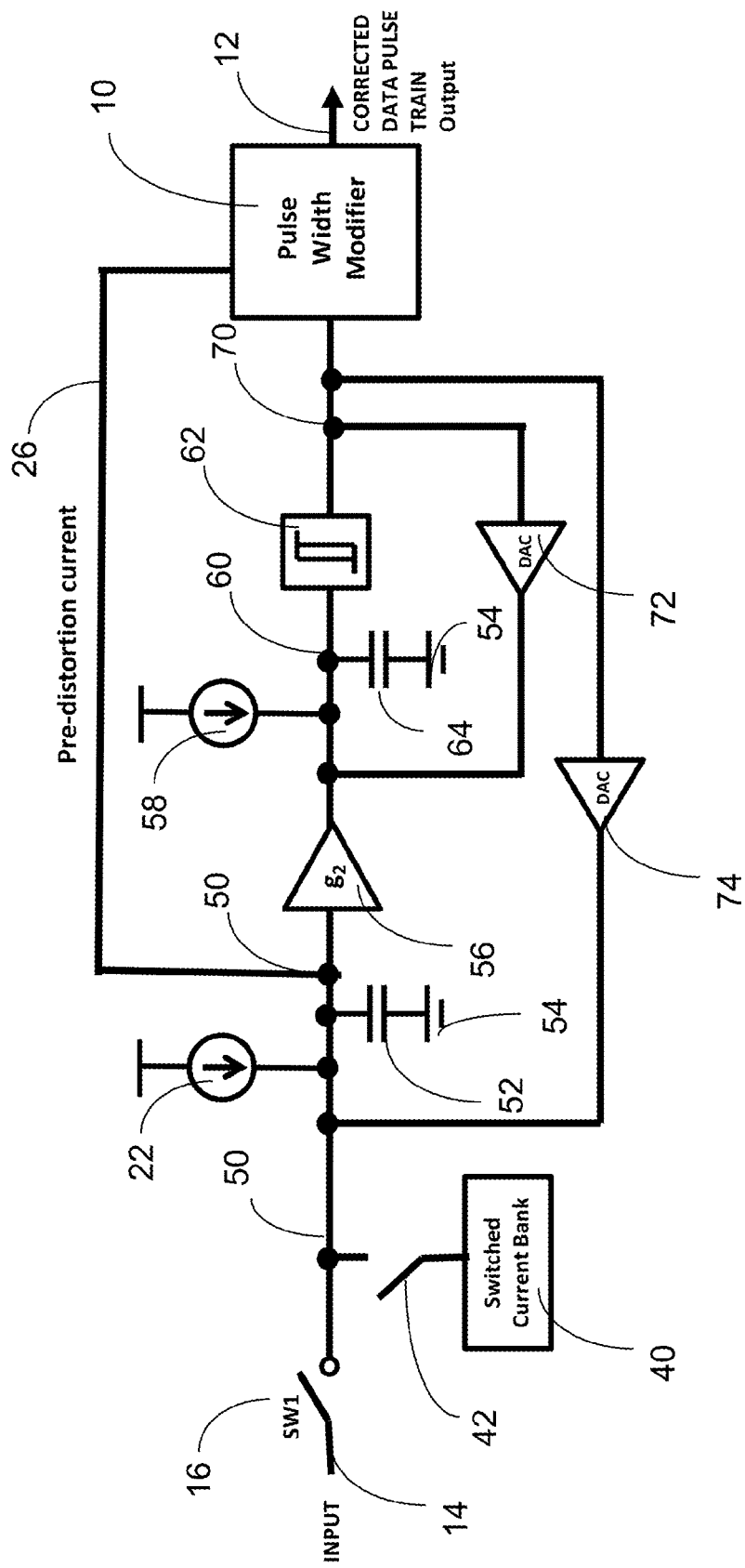
FIG. 1B shows a second order time encoder in accordance with the present disclosure.

FIG. 1B shows another embodiment of a time encoder, which is shown as a second order time encoder in accordance with the present disclosure. Higher order time encoders may also be used. This second order time encoder also has a pulse width modifier 10 for static and dynamic correction of the data pulse train output signal 12.

As shown, the time encoder of FIG. 1B has an input 14, which is connected to switch 16, which in turn is connected to a current summing point 50, which is also connected to a current source 22, a 1 bit digital to analog converter (DAC) 74, an integrator or capacitor 52, a transconductance amplifier 56, and a pre-distortion current 26 from pulse width modifier 10. The capacitor 52 is connected between the current summing point 50 and ground 54. The output of the transconductance amplifier 56 is connected to a current summing point 60 for a first order time encoder within the second order time encoder.

The current summing point 60 is also connected to a current source 58, a 1 bit digital to analog converter (DAC) 72, an integrator or capacitor 64, and a hysteresis quantizer 62. The capacitor 64 is connected between the current summing point 60 and ground 54.

In a prior art second order time encoder, the pulse width modifier 10 is not present and in that case the output 70 of the hysteresis circuit 60 is the output of the second order time encoder. In the present disclosure the output 70 is connected to the pulse width modifier 10, which has an output that is the corrected data pulse train output 12. Calibration of errors on output 70 and correction of the errors to produce the corrected data pulse train output 12 are performed in the same manner as described above.

FIG. 2 shows more detail of the pulse width modifier 10. The output 36 or the output 70, as shown in FIG. 1A or FIG. 1B, respectively, is a input to duty cycle corrector (DCC) 80, which calibrates duty cycle errors using processor 82, and then stores the duty cycle correction in memory 84. During normal operation the memory 84 is accessed by pulse adjuster 86 to correct duty cycle errors on output 36 or 70, in FIG. 1A or FIG. 1B, respectively.

A nonlinearity estimator 90 is used to characterize non-linearity errors calibrated by injecting different DC currents from switched current bank 40 into current summing point 20 or 50, of FIG. 1A or FIG. 1B, respectively. The nonlinearity estimator 90 has a counter 92 for counting the number of rising or falling edges in a time period, a processor 94 and a memory 96. The calibrated nonlinearity errors are stored in memory 96 and accessed by pre-distortion circuit 98 during normal operation. The pre-distortion circuit 98 provides pre-distortion current 26, which is injected into current summing point 20 or 50, of FIG. 1A or FIG. 1B, respectively, to correct any nonlinearity.

As discussed above, under ideal conditions the output waveform will have a symmetric 50% duty cycle without a time-varying input, as shown in waveform 100 of FIG. 2B. The period is inversely related to the free-running pulse frequency (fp). If there is asymmetry in the circuit arising from effects such as offset or mismatch, the output duty cycle will deviate from the ideal duty cycle, as shown in waveform 102 of FIG. 2B, which shows an example behavior when discharging of capacitor is faster than the charging time. This can be caused from a mismatch in capacitor values, an imbalance due to parasitics, or other process related issues.

Figure 3A:
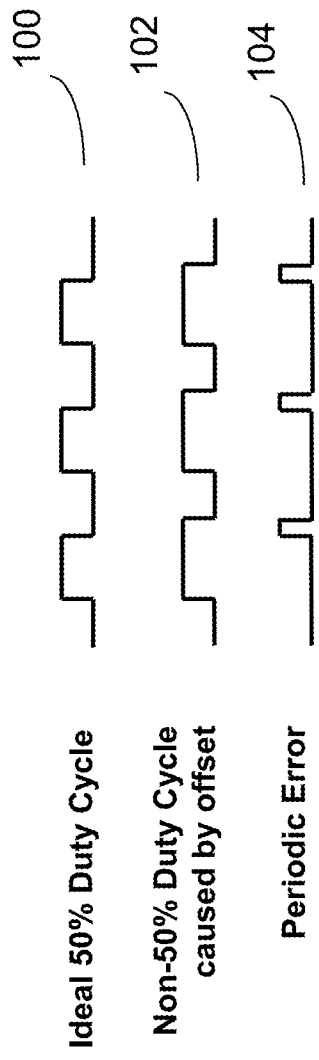
FIG. 3A shows timing diagrams for calibration for determining time encoder duty cycle errors.

FIG. 3A shows the same symmetric waveform 100 and asymmetric waveform 102, as shown in FIG. 2B, along with a calibrated duty cycle error 104 generated by the DCC 80. The duty cycle error 104 may have a positive, zero, or negative weight depending on whether the duty cycle is less, equal, or greater than 50%, respectively. The duty cycle error 104 is stored in memory 84 and read from memory 84 during normal operation and sent to the pulse adjuster 86 to correct the duty cycle error to produce the corrected data pulse train output 12.

Figure 3B:
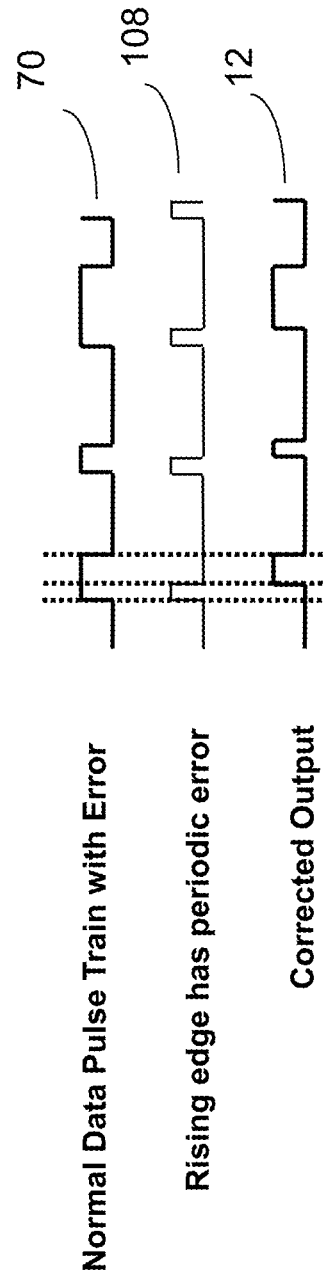
FIG. 3B shows timing diagrams for correction of time encoder duty cycle errors in accordance with the present disclosure.

FIG. 3B shows an example of the operation of the pulse adjuster 86 to correct a duty cycle error to produce the corrected data pulse train output 12. In FIG. 3B the duty cycle error 108 is aligned with the rising edge of the output 70. The pulse adjuster 86 delays the rising edge of the corrected data pulse train output 12 until the falling edge of the duty cycle error 108 and stays high until the falling edge of the output 70. In this way the error arising from static non-idealities is extracted from the time-encoder output 12 to produce the corrected data pulse train output 12.

The second function of the pulse width modifier 10 is to estimate the non-linearity in the signal path. The 1-bit DAC 12 in FIG. 1A and the 1-bit DACs 72 and 74 in FIG. 1B are ideally linear but the transconductance amplifiers 17 and 56 may be nonlinear. Rather than designing very linear transconductance amplifiers, the nonlinearity is calibrated during calibration and then the pre-distortion current 26 is used to correct the nonlinearity.

During calibration when the input 14 is disconnected, DC currents of different magnitude and polarity are injected into the current summing points 20 or 50, in FIG. 1A or 1B, respectively. Adding a DC current increases fp and decreases the period, as shown in waveform 110 of FIG. 2C, relative to a nominal period as shown in waveform 112. Conversely, reducing a DC current decreases fp and increases the period, as shown in waveform 114 of FIG. 2C, relative to the nominal period as shown in waveform 112. For small changes in input DC current, there may be a linear increase in periodicity; however, at larger changes in DC current the change in the period may not increase linearly. For example, it is likely the nonlinearity may increase the period greater than expected from a linear system. Also it is likely that there is asymmetric nonlinearity causing the error in the high and low states to differ.

Figure 4A:
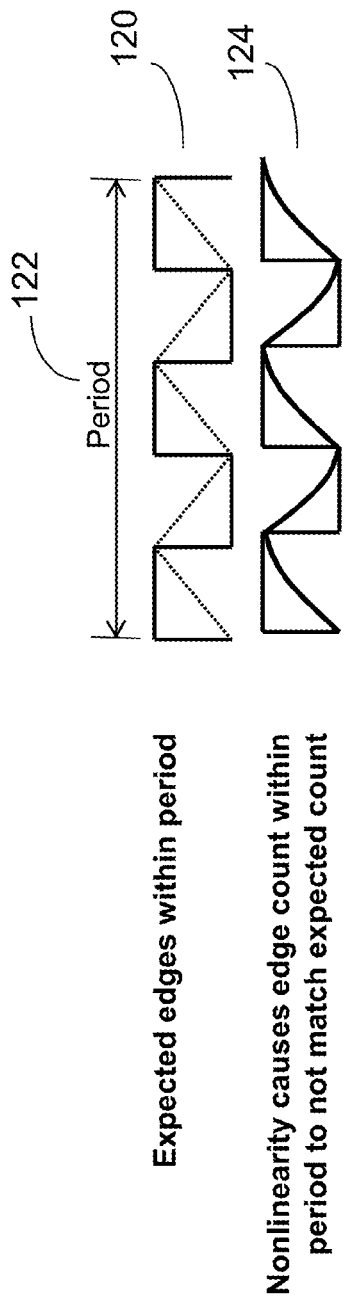
FIG. 4A shows timing diagrams for calibration for time encoder errors caused by nonlinearity.

An example is shown in FIG. 4A, showing a waveform 120 with an expected edge count of rising and falling edges within a period 122 for a particular DC current. Waveform 124 shows an example of a resultant asymmetric error due to nonlinearities, and shows that waveform 124 does not have the expected edge count of rising and falling edges within the period 122.

The counter 92 is used to track the number of rising and falling edges in a calibration cycle for various input DC currents. During normal operation the time-varying input level is tracked and using the information stored in memory 96 during calibration, an input is applied to the pre-distortion circuit 98, which injects a compensating pre-distortion current 26 into the current summing point 20 or 50, in FIG. 1A or 1B, respectively to null the predicted nonlinearity error.

Figure 4B:
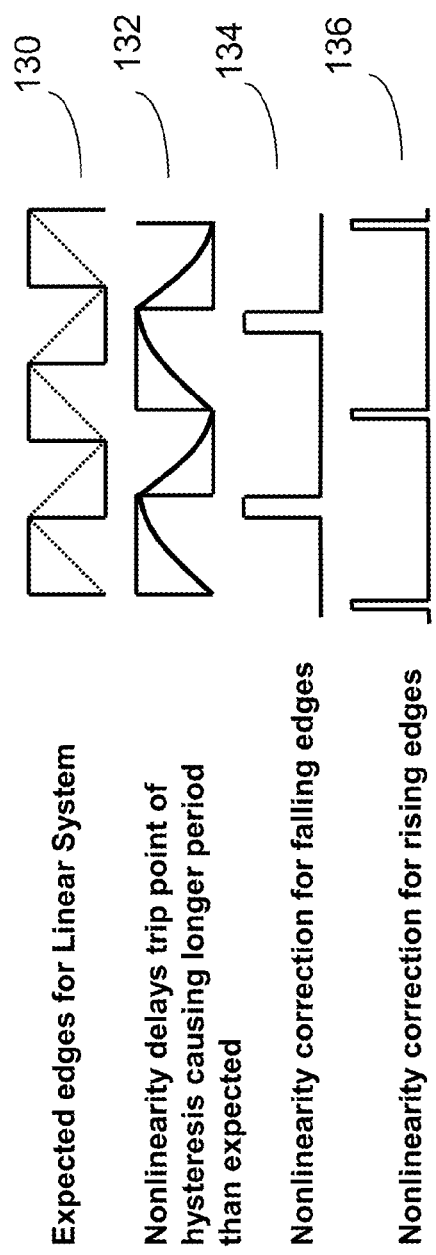
FIG. 4B shows correction of time encoder linearity errors in accordance with the present disclosure.

FIG. 4B shows an example of nonlinearity error correction. Waveform 130 shows the expected edges for a linear system, and waveform 132 shows the edges for a nonlinearity causing delays in a trip point, for example, of hysteresis quantizer 34. The calibration for nonlinearity may derive a nonlinearity correction for falling edges, as shown in waveform 134, and a nonlinearity correction for rising edges, as shown in waveform 136.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A circuit for correcting time encoder errors comprising:
   a time encoder having a time encoder input, a time encoder output, and a current summing point; and
   a pulse width modifier coupled to the time encoder output, the pulse width modifier having a current output coupled to the current summing point, and having a corrected output;
   wherein the pulse width modifier is configured to calibrate duty cycle errors and nonlinearity errors on the time encoder output, to correct the duty cycle errors and the nonlinearity errors on the time encoder output, and to output the corrected output.

2. The circuit of claim 1 further comprising:
   a first switch between the time encoder input and the current summing point;
   a current bank configured to inject selected DC currents into the current summing point; and
   a second switch between the current bank and the current summing point;
   wherein when the first switch is open and the second switch is closed to connect the current bank to the current summing point and selected DC currents are injected into the current summing point, the pulse width modifier is configured to calibrate and store nonlinearity errors;
   wherein when the first switch is open or the time encoder input has a non-time varying input, and the second switch is open, the pulse width modifier is configured to calibrate and store duty cycle errors; and
   wherein when the first switch is closed to coupled the time encoder input to the current summing point and the second switch is open, the pulse width modifier is configured to use the stored nonlinearity errors to inject a pre-distortion current via the current output into the current summing point to correct nonlinearity errors on the time encoder output, to use the stored duty cycle errors to correct duty cycle errors on the time encoder output, and to output the corrected output.

3. The circuit of claim 1 wherein the time encoder is a first order time encoder or a higher order time encoder.

4. The circuit of claim 1 wherein the time encoder comprises:
a current source coupled to the current summing point;
an integrator coupled to the current summing point;
a hysteresis quantizer having an input coupled to the current summing point, wherein an output of the hysteresis quantizer is the time encoder output; and
a 1-bit digital to analog converter coupled between the time encoder output and the current summing point.

5. The circuit of claim 4 further comprising:
a transconductance amplifier coupled between the time encoder input and the current summing point.

6. The circuit of claim 4 wherein the integrator comprises a capacitor.

7. The circuit of claim 1 wherein the time encoder comprises:
a first current source coupled to the current summing point;
an first integrator coupled to the current summing point;
a transconductance amplifier coupled to the current summing point, and having an output coupled to a second current summing point;
a second current source coupled to the second current summing point;
a second integrator coupled to the second current summing point;
a hysteresis quantizer coupled to the second current summing point, wherein an output of the hysteresis quantizer is the time encoder output;
a first 1-bit digital to analog converter coupled between the time encoder output and the current summing point; and
a second 1-bit digital to analog converter coupled between the time encoder output and the second current summing point.

8. The circuit of claim 7 wherein:
the first integrator comprises a first capacitor; and
the second integrator comprises a second capacitor.

9. The circuit of claim 1 wherein the pulse width modifier comprises:
a duty cycle corrector coupled to the time encoder output for characterizing duty cycle errors comprising:
a first processor; and
a first memory;
a pulse adjustor coupled to the time encoder output and to the duty cycle corrector for correcting duty cycle errors and for generating the corrected output;
a nonlinearity estimator coupled to the time encoder output for characterizing nonlinearity errors comprising:
a counter configured to count edges on the time encoder output within a period of time;
a second processor; and
a second memory; and
a pre-distortion circuit coupled to the non-linearity estimator and to the current summing point for correcting nonlinearity errors.

10. The circuit of claim 9 wherein:
the first and second processor are one and the same processor.

11. A method for correcting time encoder errors comprising:
providing a time encoder having a time encoder input, a time encoder output, and a current summing point;
providing a pulse width modifier coupled to the time encoder output, the pulse width modifier having a current output coupled to the current summing point, and having a corrected output;
calibrating duty cycle errors on the time encoder output using the pulse width modifier and storing the duty cycle errors;
calibrating nonlinearity errors on the time encoder output using the pulse width modifier and storing the nonlinearity errors;
correcting the duty cycle errors and nonlinearity errors; and
outputting the corrected output.

12. The method of claim 11 further comprising:
disconnecting the time encoder input from the current summing switching point, injecting selected DC currents into the current summing point, and calibrating and storing nonlinearity errors;
disconnecting the time encoder input or providing a non-time varying input on the time encoder input, and calibrating and storing duty cycle errors.

13. The method of claim 11 further comprising
connecting the time encoder input to the current summing switching point;
using the stored nonlinearity errors to inject a pre-distortion current via the current output into the current summing point to correct nonlinearity errors on the time encoder output;
using the stored duty cycle errors to correct duty cycle errors on the time encoder output; and
outputting the corrected output.

14. The method of claim 11 wherein the time encoder is a first order time encoder or a higher order time encoder.

15. The method of claim 11 wherein the time encoder comprises:
a current source coupled to the current summing point;
an integrator coupled to the current summing point;
a hysteresis quantizer having an input coupled to the current summing point, wherein an output of the hysteresis quantizer is the time encoder output; and
a 1-bit digital to analog converter coupled between the time encoder output and the current summing point.

16. The method of claim 11 wherein the time encoder comprises:
a first current source coupled to the current summing point;
an first integrator coupled to the current summing point;
a transconductance amplifier coupled to the current summing point, and having an output coupled to a second current summing point;
a second current source coupled to the second current summing point;
a second integrator coupled to the second current summing point;
a hysteresis quantizer coupled to the second current summing point, wherein an output of the hysteresis quantizer is the time encoder output;
a first 1-bit digital to analog converter coupled between the time encoder output and the current summing point; and
a second 1-bit digital to analog converter coupled between the time encoder output and the second current summing point.

17. The method of claim 11 wherein the pulse width modifier comprises:
a duty cycle corrector coupled to the time encoder output for characterizing duty cycle errors comprising:
a first processor; and
a first memory;

a pulse adjustor coupled to the time encoder output and to the duty cycle corrector for correcting duty cycle errors and for generating the corrected output;

a nonlinearity estimator coupled to the time encoder output for characterizing nonlinearity errors comprising:
- a counter configured to count edges on the time encoder output within a period of time;
- a second processor; and
- a second memory; and a pre-distortion circuit coupled to the non-linearity estimator and to the current summing point for correcting nonlinearity errors.

18. The method of claim 11 wherein calibrating nonlinearity errors on the time encoder output using the pulse width modifier and storing the nonlinearity errors comprises counting rising and falling edges within a time period.

19. A method for reducing time encoder design time comprising:

providing a time encoder having a time encoder input, a time encoder output, and a current summing point;

providing a pulse width modifier coupled to the time encoder output, the pulse width modifier having a current output coupled to the current summing point, and having a corrected output;

calibrating duty cycle errors on the time encoder output using the pulse width modifier and storing the duty cycle errors in a memory in the pulse width modifier;

calibrating nonlinearity errors on the time encoder output using the pulse width modifier and storing the nonlinearity errors in the memory in the pulse width modifier;

correcting the duty cycle errors and nonlinearity errors on the time encoder output using the stored duty cycle errors and the stored nonlinearity errors; and outputting the corrected output from the pulse width modifier.

20. The method of claim 19 further comprising:

disconnecting the time encoder input from the current summing point, injecting selected DC currents into the current summing point, and calibrating and storing nonlinearity errors;

disconnecting the time encoder input or providing a non-time varying input on the time encoder input, and calibrating and storing duty cycle errors.

21. The method of claim 20 wherein correcting the duty cycle errors and nonlinearity errors on the time encoder output using the stored duty cycle errors and the stored nonlinearity errors comprises:

connecting the time encoder input to the current summing point;

using the stored nonlinearity errors to inject a pre-distortion current via the current output into the current summing point to correct nonlinearity errors on the time encoder output;

using the stored duty cycle errors to correct duty cycle errors on the time encoder output; and outputting the corrected output.

22. The method of claim 19 wherein calibrating nonlinearity errors on the time encoder output using the pulse width modifier and storing the nonlinearity errors comprises counting rising and falling edges within a time period.

* * * * *